(12) United States Patent
Minamio et al.

(10) Patent No.: US 7,126,209 B2
(45) Date of Patent: Oct. 24, 2006

(54) LEAD FRAME, RESIN-ENCAPSULATED SEMICONDUCTOR DEVICE, AND METHOD OF PRODUCING THE SAME

(75) Inventors: Masanori Minamio, Takatsuki (JP); Haruto Nagata, Sakai (JP); Tetsushi Nishio, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/018,541

(22) Filed: Dec. 21, 2004

(65) Prior Publication Data
US 2005/0110121 A1    May 26, 2005

Related U.S. Application Data

(62) Division of application No. 10/652,790, filed on Aug. 29, 2003, now abandoned.

(30) Foreign Application Priority Data
Aug. 30, 2002    (JP)    ............... 2002-254369

(51) Int. Cl.
*H01L 23/495* (2006.01)
(52) U.S. Cl. ............ 257/666; 257/686; 257/676; 257/778; 257/738; 257/777; 257/784
(58) Field of Classification Search ............ 257/666, 257/706, 676, 678, 692, 680, 686, 778, 738, 257/777, 784
See application file for complete search history.

(56) References Cited

U.S. PATENT DOCUMENTS

| | | | |
|---|---|---|---|
| 5,471,088 A | 11/1995 | Song | |
| 5,648,682 A | 7/1997 | Nakazawa et al. | |
| 5,952,714 A * | 9/1999 | Sano et al. | 257/680 |
| 6,297,543 B1* | 10/2001 | Hong et al. | 257/666 |
| 6,303,997 B1* | 10/2001 | Lee | 257/778 |
| 6,337,510 B1* | 1/2002 | Chun-Jen et al. | 257/666 |
| 6,380,620 B1 | 4/2002 | Suminoe et al. | |
| 6,630,729 B1* | 10/2003 | Huang | 257/676 |

FOREIGN PATENT DOCUMENTS

| | | |
|---|---|---|
| JP | 2001-077277 | 3/2001 |
| JP | 2002-043554 | 2/2002 |

* cited by examiner

*Primary Examiner*—Andy Huynh
*Assistant Examiner*—Tram H. Nguyen
(74) *Attorney, Agent, or Firm*—Hamre, Schumann, Mueller & Larson, P.C.

(57) ABSTRACT

A resin-encapsulated semiconductor device includes: a semiconductor chip on a surface of which a group of electrodes is disposed; a plurality of inner leads arranged along a periphery of the semiconductor chip; connecting members for connecting the electrodes of the semiconductor chip with the respective inner leads, an encapsulating resin for encapsulating surfaces of the semiconductor chip and the connecting members; and external electrodes exposed from the encapsulating resin. Each of the inner leads extends across the periphery of the semiconductor chip from an internal side to an external side of the periphery, and includes a protruded portion provided on a surface of the inner lead on an external side relative to the periphery of the semiconductor chip, the protruded portion being protruded in a thickness direction. Conductive bumps as the connecting members on the electrodes of the semiconductor chip are connected with internal portions of the respective inner leads, the internal portions being positioned inward relative to the protruded portions. The external electrodes are formed on surfaces of the protruded portions, and tip ends of the external electrodes are protruded relative to a back face of the semiconductor chip.

5 Claims, 8 Drawing Sheets

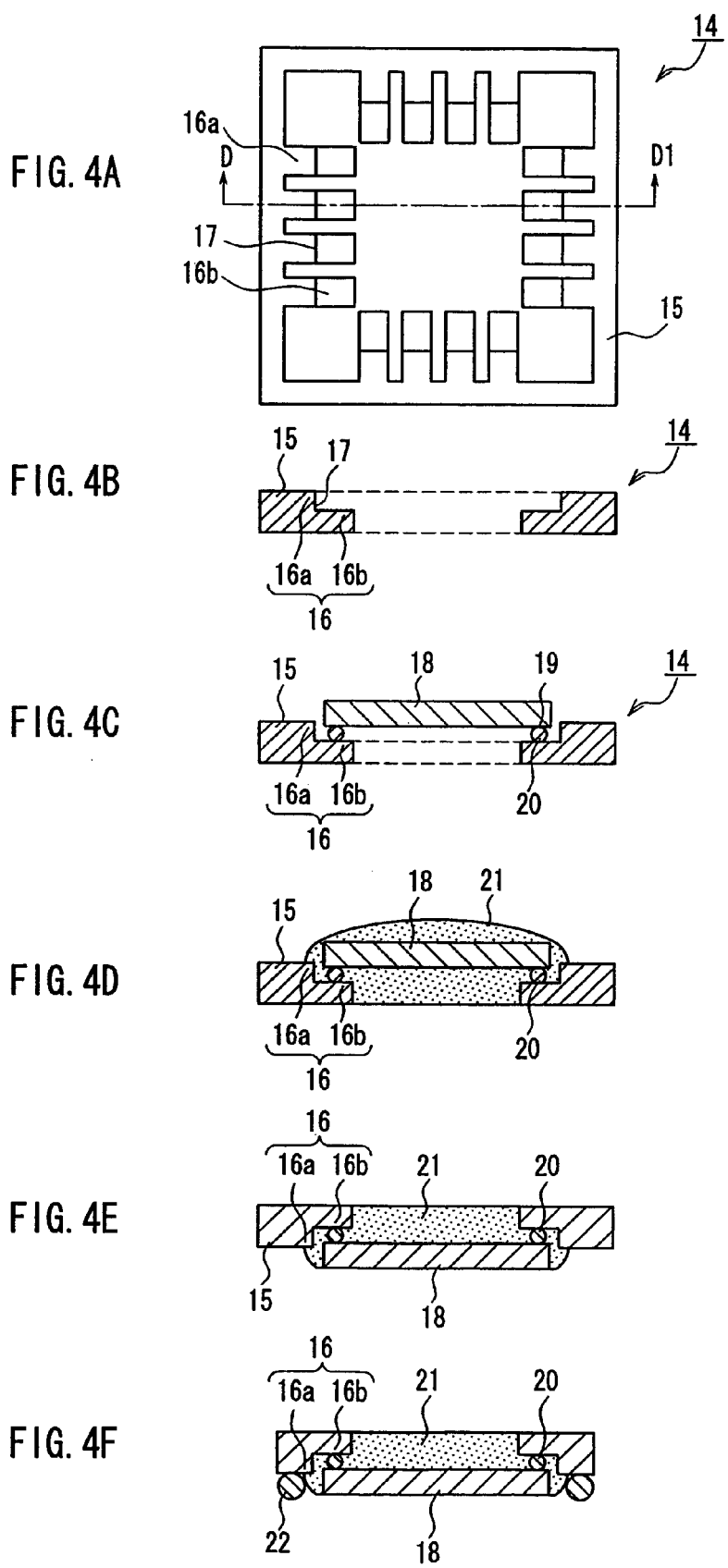

US 7,126,209 B2

LEAD FRAME, RESIN-ENCAPSULATED SEMICONDUCTOR DEVICE, AND METHOD OF PRODUCING THE SAME

This application is a Division of application Ser. No. 10/652,790, filed Aug. 29, 2003 now abandoned, which application is incorporated herein by reference.

BACKGROUND OF THE INVENTION

1. Field of the Invention

The present invention relates to a resin-encapsulated semiconductor device using a lead frame. Particularly, it relates to a resin-encapsulated semiconductor device having a structure suitable for reducing thickness and suitable for the speed enhancement of elements in the structure called SIP (System In Package), and relates to the method for producing the same.

2. Related Background Art

Conventionally, a resin-encapsulated semiconductor device called "QFN (Quad Flat Non-leaded Package)" in which only one side thereof is encapsulated with an encapsulating resin has been developed as a compact and thin resin-encapsulated semiconductor device. The following will describe the conventional QFN-type resin-encapsulated semiconductor device.

First of all, the following describes a lead frame used in a resin-encapsulated semiconductor device. FIG. 9 is a plan view illustrating a conventional lead frame. The lead frame has a structure in which a die pad 3 arranged substantially at center in an opening region 2 of a frame 1 is supported by hanging leads 4. One end of each of the hanging leads 4 is connected with each of the corners of the die pad 3, while the other end thereof is connected with the frame 1. Further, the frame 1 is provided with a plurality of inner leads 5, which are arranged so that ends thereof are directed toward corresponding edges of the die pad 3.

Next, the following describes a conventional resin-encapsulated semiconductor device employing the foregoing lead frame. FIGS. 10A and 10B show a conventional resin-encapsulated semiconductor device. FIG. 10A is a bottom view of a resin-encapsulated semiconductor device, and FIG. 10B is a cross-sectional view of the device taken along a line A–A1 in FIG. 10A. A semiconductor chip 6 is bonded on the die pad 3, and the frame 1 of the lead frame (see FIG. 9) is cut away so that the inner leads 5 are separated from one another. Electrodes 7 of the semiconductor chip 6 are connected electrically with surfaces of the inner leads 5 via thin metal wires 8, respectively. Surroundings of the semiconductor chip 6 are encapsulated with an encapsulating resin 9, with a bottom face of the die pad 3 and bottom faces of the inner leads 5 being exposed. The bottom faces and side faces of the inner leads 5 are exposed on a bottom face and side faces of the resin-encapsulated semiconductor device, respectively, thereby forming external terminals 10.

Next, the following describes a method for producing the resin-encapsulated semiconductor device shown in FIGS. 10A and 10B. FIGS. 11A to 11E illustrate steps of the producing method by showing, like FIG. 10B, the cross-sections taken along the line A–A1 of FIG. 10A.

First, a lead frame as shown in FIG. 11A is prepared. The lead frame is the same as that shown in FIG. 9, though the illustration of the frame 1 (see FIG. 9) is omitted therein. A die pad 3 on which a semiconductor chip is to be mounted, and a plurality of inner leads 5 arranged so that ends thereof are directed toward edges of the die pad 3, are illustrated in the drawing. Next, as shown in FIG. 11B, a semiconductor chip 6 is mounted on the die pad 3 of the lead frame by bonding. Then, as shown in FIG. 11C, the semiconductor chip 6 is connected electrically with surfaces of the inner leads 5 via thin metal wires 8.

Subsequently, as shown in FIG. 11D, a structure in a state in which a sheet material 11 is stuck on the bottom face of the lead frame including the inner lead 5 is placed in a molding die 12. Then, an encapsulating resin is injected into the molding die and heated, whereby the surroundings of the semiconductor chip 6 are encapsulated with the resin while bottom faces of the die pad 3 and the inner leads 5 are exposed. Next, as shown in FIG. 11E, a resin-encapsulated semiconductor device 13 is taken out of the molding die.

However, the conventional resin-encapsulated semiconductor device as described above has an increased overall thickness since the thin metal wires are used for connecting the electrodes of the semiconductor chip with the inner leads, and hence, there are limits to the thinning of the device. Further, in a situation in which high-speed signals or high-frequency signals operate, loss of signals in the thin metal wires becomes a problem, which makes it impossible to allow the semiconductor chip to function fully.

Further, since the external terminals are exposed only on the bottom face of the resin-encapsulated semiconductor device, when a plurality of resin-encapsulated semiconductor devices are stacked, electric connection between the devices cannot be achieved through external terminals thereof. Therefore, it is difficult to implement the three-dimensional packaging.

SUMMARY OF THE INVENTION

Therefore, it is an object of the present invention to provide a connection structure of inner leads and electrodes of a semiconductor chip that allows a resin-encapsulated semiconductor device to be formed thinner, and reduces the loss of signals. Further, it is an object of the present invention to provide a connection structure that, in the case where a plurality of semiconductor devices are stacked, allows the semiconductor devices to be connected electrically with one another.

A lead frame of the present invention includes a frame, and a plurality of inner leads extending inward from the frame, wherein each of the inner leads includes a protruded portion provided on a surface of an external side portion thereof, the protruded portion being protruded in a thickness direction.

A resin-encapsulated semiconductor device of the present invention includes: a semiconductor chip on a surface of which a group of electrodes is provided; a plurality of inner leads arranged along a periphery of the semiconductor chip; connecting members for connecting the electrodes of the semiconductor chip with the respective inner leads; an encapsulating resin for encapsulating surfaces of the semiconductor chip and the connecting members; and external electrodes exposed from the encapsulating resin. Each of the inner leads extends across the periphery of the semiconductor chip from an internal side to an external side of the periphery, and includes a protruded portion provided on a surface of the inner lead on an external side relative to the periphery of the semiconductor chip, the protruded portion being protruded in a thickness direction. Conductive bumps that are formed as the connecting members on the electrodes of the semiconductor chip are connected with internal portions of the respective inner leads, the internal portions being positioned inward relative to the protruded portions. The external electrodes are formed on surfaces of the protruded portions, and tip ends of the external electrodes are protruded relative to a back face of the semiconductor chip.

In a resin-encapsulated semiconductor device of another configuration of the present invention, the semiconductor chip includes a first semiconductor chip, and a second semiconductor chip that is smaller in size than the first semiconductor chip and is stacked on a surface of the first semiconductor chip. The first semiconductor chip has a first electrode group composed of electrodes arranged on its peripheral portion, and a second electrode group composed of electrodes arranged in an area inward relative to the first electrode group. Each of the inner leads extends across the periphery of the first semiconductor chip from an internal side to an external side of the periphery, and includes a protruded portion provided on a surface of the inner lead on an external side relative to the periphery of the first semiconductor chip, the protruded portion being protruded in a thickness direction. Conductive bumps that are formed as the connecting members on the electrodes of the first electrode group of the first semiconductor chip are connected with internal portions of the respective inner leads, the internal portions being positioned inward relative to the protruded portions. The second semiconductor chip is disposed in a region surrounded by internal ends of the inner leads, and is connected electrically with the electrodes of the second electrode group of the first semiconductor chip via conductive bumps. The encapsulating resin encapsulates surfaces of the first and second semiconductor chips and the conductive bumps. The external electrodes are formed on surfaces of the protruded portions, and tip ends of the external electrodes are protruded relative to a back face of the first semiconductor chip.

A method for producing a resin-encapsulated semiconductor device of the present invention includes the following steps. First, a lead frame that includes a frame and a plurality of inner leads that extend inward from the frame is prepared. Each of the inner leads has a protruded portion provided on a surface of an external side portion thereof, the protruded portion being protruded in a thickness direction. In addition, a semiconductor chip having a size such that its periphery falls within an area inward relative to the protruded portions of the inner leads is prepared. Conductive bumps are formed on electrodes of the semiconductor chip, and the electrodes of the semiconductor chip are connected electrically with internal portions of the respective inner leads via the conductive bumps, the internal portions being positioned inward relative to the protruded portions. Then, a region including surfaces of the semiconductor chip and the conductive bumps are encapsulated with an encapsulating resin, with the frame and the protruded portions of the inner leads being exposed, and the frame is removed from the encapsulated structure. Next, external electrodes are provided on surfaces of the protruded portions so that tip ends of the external electrodes are protruded relative to a back face of the semiconductor chip.

A method for producing a resin-encapsulated semiconductor device of another configuration of the present invention is a method for stacking and connecting two semiconductor chips, and includes the following steps. First, a lead frame that includes a frame and a plurality of inner leads that extend inward from the frame is prepared. Each of the inner leads has a protruded portion provided on a surface of an external side portion thereof, the protruded portion being protruded in a thickness direction. In addition, a first semiconductor chip and a second semiconductor chip are prepared. The first semiconductor chip has a first electrode group composed of electrodes arranged in its peripheral portion and a second electrode group composed of electrodes arranged inward relative to the first electrode group. The second semiconductor chip is smaller in size than the first semiconductor chip, and has electrodes. First conductive bumps are formed on the electrodes of the first electrode group of the first semiconductor chip, and second conductive bumps are formed on the electrodes of the second semiconductor chip. The second semiconductor chip is stacked on a surface of the first semiconductor chip, and the electrodes of the second electrode group of the first semiconductor chip are connected electrically with the second conductive bumps on the second semiconductor chip. The first conductive bumps are connected electrically with internal portions of the respective inner leads, the internal portions being positioned inward relative to the protruded portions. Then, a region including surfaces of the first and second semiconductor chips and the first and second conductive bumps is encapsulated with an encapsulating resin, with the frame and the protruded portions of the inner leads being exposed, and the frame is removed form the encapsulated structure. External electrodes are formed on surfaces of the protruded portions so that tip ends of the external electrodes are protruded relative to a back face of the first semiconductor chip.

BRIEF DESCRIPTION OF THE DRAWINGS

FIG. 2A is a plan view, FIG. 2B is a side view, FIG. 2C is a back view, and FIG. 2D is a cross-sectional view.

FIGS. 4A to 4F are views illustrating steps of a method for producing the resin-encapsulated semiconductor device. FIG. 4A is a plan view, and FIGS. 4B to 4F are cross-sectional views.

FIG. 5A is a plan view, FIG. 5B is a side view, FIG. 5C is a back view, and FIG. 5D is a cross-sectional view.

FIG. 7A is a plan view, and FIGS. 7B to 7F are cross-sectional views.

FIG. 8A is a plan view, and FIGS. 8B to 8G are cross-sectional views.

DETAILED DESCRIPTION OF THE INVENTION

Figure 1A:
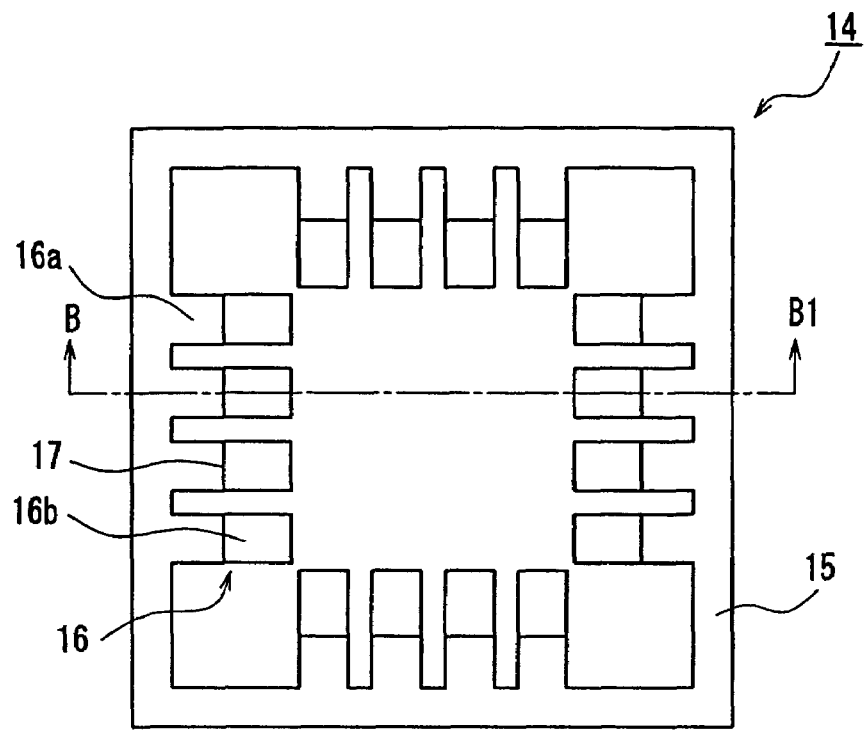
FIG. 1A is a plan view illustrating a lead frame according to Embodiment 1 of the present invention.

The lead frame of the present invention and the resin-encapsulated semiconductor device using the same employ a configuration in which the inner leads are connected with electrodes of a semiconductor chip, not via thin metal wires as in the prior art, but via conductive bumps. Therefore, a structure with reduced connection distances is achieved, which allows a resin-encapsulated semiconductor device to be formed thinner, and allows the loss of signals to be reduced in the environment in which high-speed signals or high-frequency signals operate. Further, since either the inner leads or the external electrodes are exposed on both faces of the resin-encapsulated semiconductor device, the configuration allows a plurality of the devices to be stacked and connected electrically with one another easily. The method for producing a resin-encapsulated semiconductor device of the present invention enables efficient production of the resin-encapsulated semiconductor device of the foregoing configuration.

In the lead frame of the present invention, a thickness of the protruded portion of each inner lead may be substantially equal to a thickness of the frame. Further, an insulation tape may be stuck on a surface of each protruded portion so that the protruded portion is supported by the insulation tape.

In the resin-encapsulated semiconductor device of the present invention, it is preferable that back faces of the inner leads or a back face of the second semiconductor chip are positioned substantially in the same plane as that of an external face of the encapsulating resin. Further, external end faces of the inner leads preferably form substantially the same plane as that of an external face of the encapsulating resin. Still further, each of the internal portion of the inner leads preferably is inclined from a back face of the inner lead to a protruded side of the protruded portion toward an internal end of the internal portion.

In the method for producing a resin-encapsulated semiconductor device of the present invention, a back face of the second semiconductor chip and back faces of the inner leads may be ground at the same time after the encapsulation.

The following will specifically describe a lead frame, a resin-encapsulated semiconductor device employing the same, and a method for producing the same according to embodiments of the present invention, while referring to the drawings.

Embodiment 1

Figure 1B:
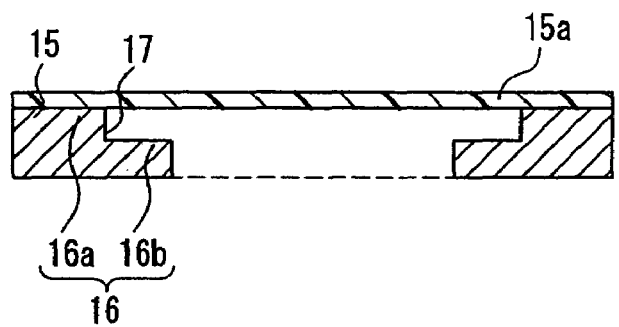
FIG. 1B is a cross-sectional view of the lead frame.

First, the following describes a structure of a lead frame according to Embodiment 1. FIG. 1A is a plan view illustrating a lead frame according to the present embodiment, and FIG. 1B is a cross-sectional view of the lead frame taken along a line B–B1 shown in FIG. 1A.

A lead frame 14 is made of, for instance, a copper material or a 42-alloy with a thickness of 150 µm. The lead frame 14 includes a frame 15 and a plurality of inner leads 16 formed so as to extend inwardly from the frame 15. Each inner lead 16 includes a protruded portion 16a on its external side portion, and a step portion 17 is provided between the protruded portion 16a and an internal portion 16b of the inner lead 16. The inner lead 16, at a position of the protruded portion 16a, has a thickness substantially equal to that of the frame 15. The thickness of the lead frame 14 desirably is set in a range of 100 µm to 300 µm. Further, an insulation tape 15a may be stuck on a surface of the protruded portion 16a of each inner lead 16 so as to support the protruded portion 16a.

Figure 2A:
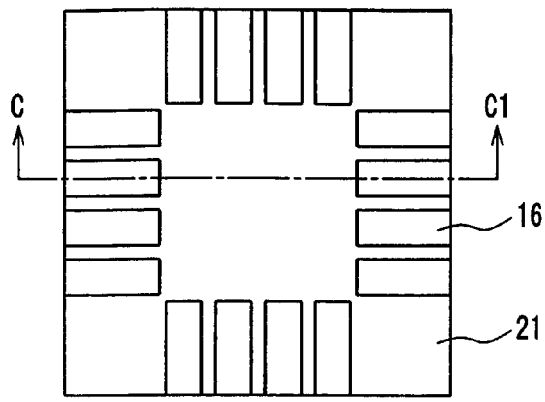
FIGS. 2A to 2D are views illustrating a resin-encapsulated semiconductor device according to Embodiment 1 of the present invention.
Figure 2B:
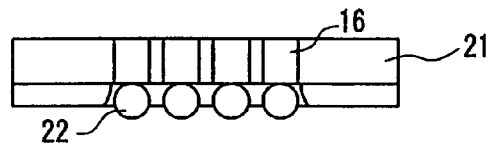
Figure 2C:
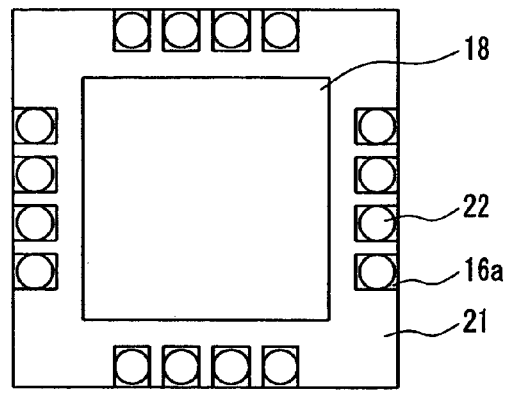
Figure 2D:
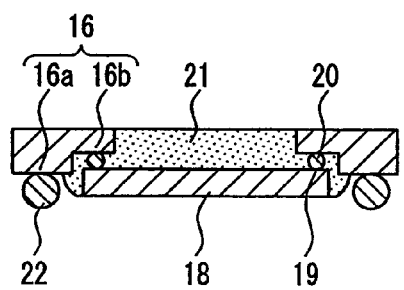

Next, the following describes a structure of a resin-encapsulated semiconductor device according to the present embodiment employing the lead frame configured as described above. FIGS. 2A to 2D illustrate the resin-encapsulated semiconductor device, and FIGS. 2A to 2C are a plan view, a side view, and a bottom view of the same, respectively, while FIG. 2D is a cross-sectional view of the same taken along a line C–C1 shown in FIG. 2A.

As shown in FIG. 2D, conductive bumps 20 are formed on electrodes 19 of a semiconductor chip 18. The internal portion 16b of each inner lead 16 extends inward relative to a periphery of the semiconductor chip 18, and is connected with a corresponding one of the conductive bumps 20. The protruded portion 16a of each inner lead 16 is positioned on an external side relative to the periphery of the semiconductor chip 18. Further, a surface region of the semiconductor chip 18 including the conductive bumps 20 is encapsulated with an encapsulating resin 21. As shown in FIG. 2C also, at least a surface of the protruded portion 16a is exposed from the encapsulating resin 21. Further, ball electrodes made of solder or the like are provided as external electrodes 22 on the surfaces of the protruded portions 16a, and tip ends of the external electrodes 22 are protruded relative to a back face of the semiconductor chip 18, as shown in FIG. 2B.

Further, in the present embodiment, each of the internal portions 16b of the inner leads 16 may be inclined slightly from a back face of the inner lead to protruded side of the protruded portion 16a toward an internal end of the internal portion 16b. Aback face of the inner lead 16, that is, a surface thereof on a side opposite to the semiconductor-chip-18-mounted side, is positioned substantially in the same plane as that of an external surface of the encapsulating resin 21. In a case where the internal portions 16b are inclined from a back face of the inner lead to the protruded side of the protruded portion 16a, as mentioned above, the back face of the inner lead 16 forms a slight recess. Further, external end faces of the inner leads 16 compose substantially the same planes that the external surfaces of the encapsulating resin 21 compose.

Figure 3:
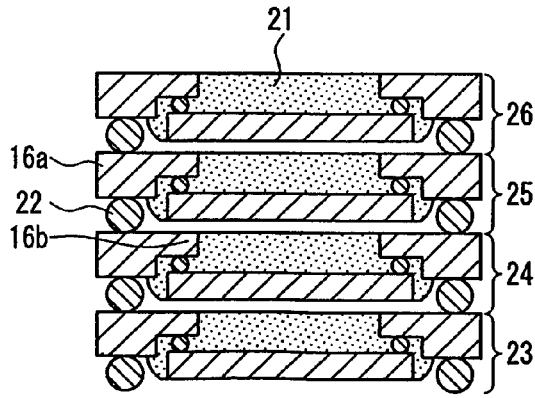
FIG. 3 is a cross-sectional view illustrating a package obtained by stacking a plurality of the resin-encapsulated semiconductor devices.

FIG. 3 is a cross-sectional view illustrating a state in which a plurality of resin-encapsulated semiconductor devices 23 to 26, each having the above-described structure, are stacked, and vertically adjacent ones of the resin-encapsulated semiconductor devices of the stack thus obtained are connected electrically with each other. For instance, back faces of the protruded portions 16a of the inner leads 16 in the resin-encapsulated semiconductor device 25 arranged under the resin-encapsulated semiconductor device 26 are connected via the external electrodes 22 with top faces of the protruded portions 16a of the resin-encapsulated semiconductor device 26. With this configuration, even in the case where a plurality of resin-encapsulated semiconductor devices are stacked, the electric connection of the resin-encapsulated semiconductor devices is achieved easily, whereby a multifunctional package can be obtained.

It should be noted that in the present embodiment, an insulation thin film may be formed on the exposed portions of the inner leads 16 that are exposed from the encapsulating resin 21 except for regions that need to be exposed for electric connection with an external board.

As described above, since the resin-encapsulated semiconductor device according to the present embodiment is configured so that the inner leads 16 are connected electrically directly with the conductive bumps 20 formed on the electrodes of the semiconductor chip 18, it is possible to provide a thin resin-encapsulated semiconductor device.

Further, as compared with the case where the inner leads 16 are connected with the electrodes of the semiconductor chip 18 via thin metal wires, the loss of signals is suppressed, whereby the semiconductor chip 18 is able to fully perform the function of processing high-speed signals or high-frequency signals.

Further, since the electrodes exposed from the encapsulating resin 21, i.e., the inner leads 16 or the external electrodes 22, are provided not only on one face on one side of the resin-encapsulated semiconductor device, but also on faces on both sides thereof, a plurality of the foregoing resin-encapsulated semiconductor devices can be stacked, with the inner leads 16 of one device being connected with the external electrodes 22 of another device. Thus, the three-dimensional packaging of resin-encapsulated semiconductor devices can be implemented.

Next, the following describes a method for producing the resin-encapsulated semiconductor device according to the present embodiment, while referring to FIGS. 4A to 4F that illustrate steps of the method, respectively. FIG. 4A is a plan view of the lead frame 14, and FIGS. 4B to 4F are cross-sectional views of the same taken along a line D–D1 shown in FIG. 4A.

First, as shown in FIGS. 4A and 4B, a lead frame 14 formed with a metal plate made of, for instance, a copper material or a 42-alloy is prepared. This lead frame 14 is similar to that shown in FIGS. 1A and 1B, and includes a frame 15 and a plurality of inner leads 16 formed so as to extend from the frame 15 inward. Each inner lead 16 includes a protruded portion 16a and an internal portion 16b, which form a step portion 17 therebetween.

Next, as shown in FIG. 4C, the semiconductor chip 18 is mounted on the lead frame 14, and conductive bumps 20 formed on electrodes 19 of the semiconductor chip 18 are connected electrically with the internal portions 16b of the inner leads 16.

Subsequently, as shown in FIG. 4D, an encapsulating resin 21 is provided to encapsulate a region including at least surfaces of the semiconductor chip 18 and the conductive bumps 20, except for the frame 15, the protruded portions 16a of the inner leads 16, and back faces of the inner leads 16. The encapsulation can be carried out by, for instance, dripping the encapsulating resin 21 to the semiconductor chip 18 from its back face side so that the resin is coated thereon.

FIG. 4E is a view illustrating the device turned upside down from the state shown in FIG. 4D. As shown in FIG. 4E, by carrying out the so-called back grinding with a rotating grindstone (not shown) on the back face side of the semiconductor chip 18, the encapsulating resin 21 is ground to be removed until the back face of the semiconductor chip 18 is exposed. Further, it also is possible to make the resin-encapsulated semiconductor device thinner by further grinding the semiconductor chip 18 on the back face side.

Then, as shown in FIG. 4F, the semiconductor device encapsulated with the encapsulating resin 21 is separated from the frame 15. Further, ball electrodes made of solder or the like are provided as external electrodes 22 on surfaces of the protruded portions 16a of the inner leads 16. Here, the size of each external electrode 22 is determined so that a tip end of the external electrode 22 protrudes relative to the back face of the semiconductor chip 18. Subsequently, the inner leads 16 are cut at end portions thereof where the inner leads 16 are connected with the frame 15, and the end faces thereof are adjusted so as to be positioned substantially in the same planes as that of side faces of the encapsulating resin 21.

It should be noted that in the step shown in FIG. 4D, the resin encapsulation may be carried out using a molding sheet (not shown). The molding sheet is applied so as to be in close contact with surfaces of the protruded portions 16a of the inner leads 16, thereby surely preventing the encapsulating resin 21 from adhering to surfaces of the protruded portions 16a. Further, the molding sheet may be applied so that the surfaces of the protruded portions 16a intrudes into the molding sheet. Since this allows the protruded portions 16 to protrude surely from the encapsulating resin, this ensures the electric connection at the protruded portions 16a.

The method for producing the resin-encapsulated semiconductor device according to the present embodiment allows the resin-encapsulated semiconductor device to have a decreased thickness. More specifically, the method makes it possible to easily provide a resin-encapsulated semiconductor device with a thickness of not more than 0.8 mm. Further, it allows the loss of signals to be suppressed in the environment in which high-speed signals or high-frequency signals operate. Still further, it enables the three-dimensional stacking of resin-encapsulated semiconductor devices, since the back faces of the inner leads 16 and the top faces of the protruded portions 16a are exposed from the encapsulating resin.

Embodiment 2

Figure 5A:
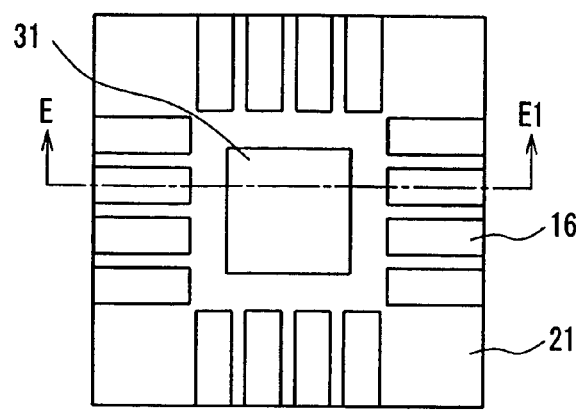
FIGS. 5A to 5D are views illustrating a resin-encapsulated semiconductor device according to Embodiment 2 of the present invention.
Figure 5B:
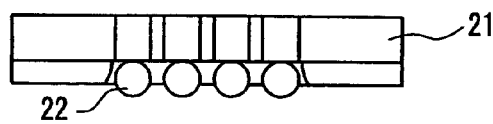
Figure 5C:
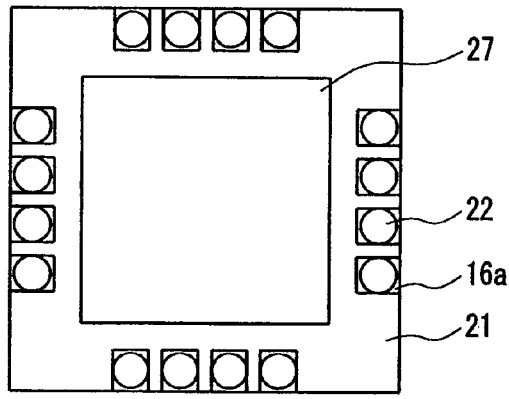
Figure 5D:
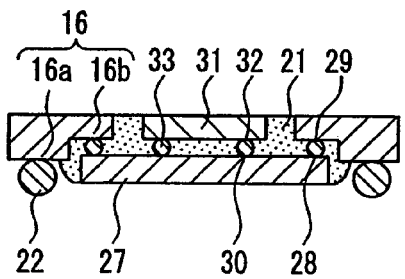

The following will describe a second structure of a resin-encapsulated semiconductor device according to Embodiment 2, while referring to FIGS. 5A to 5D. FIG. 5A is a plan view illustrating a resin-encapsulated semiconductor device, FIG. 5B is a side view of the same, FIG. 5C is a bottom view of the same, and FIG. 5D is a cross-sectional view of the same taken along a line E–E1 shown in FIG. 5A. It should be noted that the same constituent elements as those of Embodiment 1 are designated with the same reference numerals, and descriptions of the same are not repeated.

In the resin-encapsulated semiconductor device, the same lead frame as that of Embodiment 1 is used. As shown in FIG. 5D, first conductive bumps 29 are formed on first electrodes 28 arranged in a peripheral portion of a first semiconductor chip 27. An internal portion 16b of each inner lead 16 extends inward relative to the periphery of the first semiconductor chip 27, and the first conductive bumps 29 are connected with the internal portions 16b. A protruded portion 16a of each inner lead 16 is positioned on an external side relative to the periphery of the first semiconductor chip 27, and a ball electrode made of solder or the like is provided as an external electrode 22 on a surface of each protruded portion 16a. Tip ends of the external electrodes 22 are protruded relative to a back face of the first semiconductor chip 27.

In the region surrounded by internal ends of the plurality of the inner leads 16, a second semiconductor chip 31 is disposed, which has a size smaller than that of the first semiconductor chip 27. In an inward area of the surface of the first semiconductor chip 27 surrounded by the first electrodes 28, second electrodes 30 are formed so as to face the second semiconductor chip 31. The second electrodes 30 of the first semiconductor chip 27 are connected electrically with electrodes 32 of the second semiconductor chip 31 via second conductive bumps 33. Surfaces of the first and second semiconductor chips 27 and 31, as well as the first and second conductive bumps 29 and 33 are encapsulated with an encapsulating resin 21 in a manner such that at least surfaces of the protruded portions 16a of the inner leads 16 are exposed.

Figure 6:
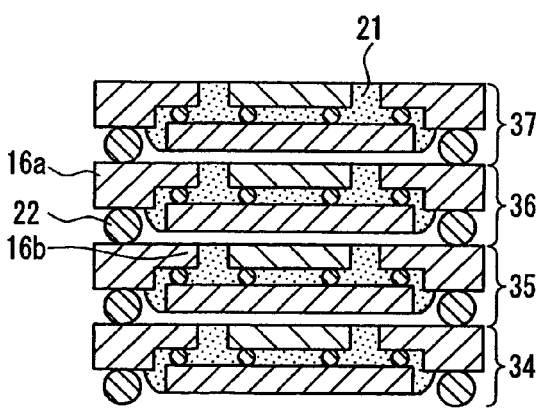
FIG. 6 is a cross-sectional view illustrating a package obtained by stacking a plurality of the resin-encapsulated semiconductor devices.

FIG. 6 is a cross-sectional view illustrating a state in which a plurality of resin-encapsulated semiconductor devices 34 to 37, each having the structure according to the present embodiment, are stacked. Thus, as in Embodiment 1, back faces of the protruded portions 16a in the semiconductor device 35 arranged under the resin-encapsulated semiconductor device 36 are connected with top faces of the protruded portions 16a of the resin-encapsulated semiconductor device 36 via the external electrodes 22 formed with ball electrodes. With this configuration, even in the case where a plurality of resin-encapsulated semiconductor devices are stacked, the electric connection of the resin-encapsulated semiconductor devices is achieved easily, whereby a multifunctional package can be obtained.

Figure 7A:
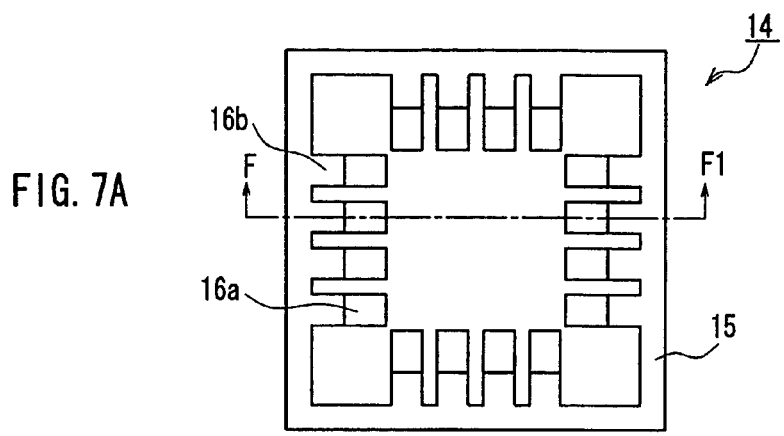
FIGS. 7A to 7F are views illustrating steps of a method for producing the resin-encapsulated semiconductor device.

The following describes a method for producing the resin-encapsulated semiconductor device according to the present embodiment, while referring to FIGS. 7A to 7F illustrating respective steps of the method. FIG. 7A is a plan view of the lead frame 14, and FIGS. 7B to 7F are cross-sectional views of the same taken along a line F–F1 shown in FIG. 7A.

Figure 7B:
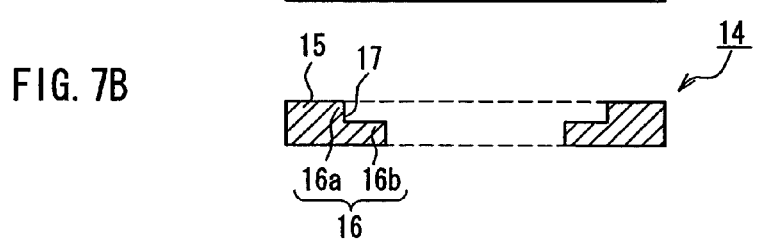

First, as shown in FIGS. 7A and 7B, a lead frame 14 formed with a metal plate made of, for instance, a copper material or a 42-alloy is prepared. This lead frame 14 is similar to that shown in FIGS. 1A and 1B.

Figure 7C:
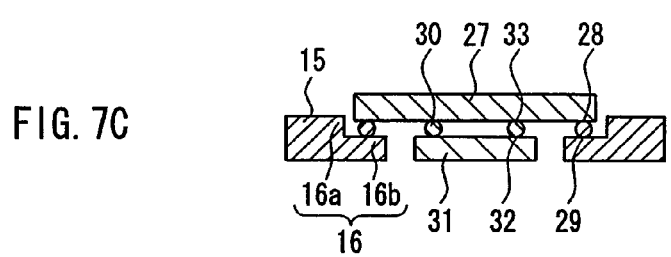

At the same time, as shown in FIG. 7C, a set of connected semiconductor chips of the chip-on-chip (COC) type is produced in which the first semiconductor chip 27 is connected electrically with the second semiconductor chip 31 that is smaller than the first semiconductor chip 27. Here, the first conductive bumps 29 and the second conductive bumps 33 are formed on the first electrodes 28 and the second electrodes 30 formed on the first semiconductor chip 27, respectively. Then, the second electrodes 30 of the first semiconductor chip 27 are connected electrically with the electrodes 32 of the second semiconductor chip 31 via the second conductive bumps 33.

Then, the above-described set of connected semiconductor chips is mounted on the lead frame 14, and the first electrodes 28 of the first semiconductor chip 27 are connected electrically with surfaces of the internal portions 16b of the inner leads 16. Here, by setting the thickness of the internal portions 16b and the thickness of the second semiconductor chip 31 so that they are equal to each other, the back faces of the inner leads 16 and the back face of the second semiconductor chip 31 are positioned substantially in the same plane.

Figure 7D:
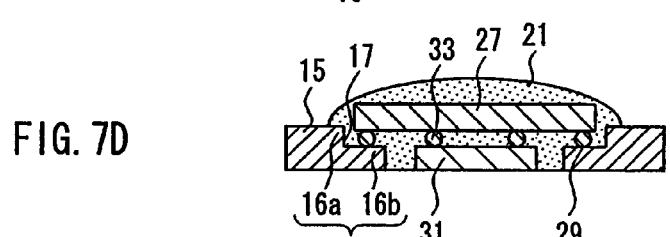

Subsequently, as shown in FIG. 7D, the encapsulating resin 21 is provided to encapsulate a region including the surfaces of the first and second semiconductor chips 27 and 31 as well as the first and second conductive bumps 29 and 33, except for the frame 15, the protruded portions 16a of the inner leads 16, and the back faces of the inner leads 16.

Figure 7E:
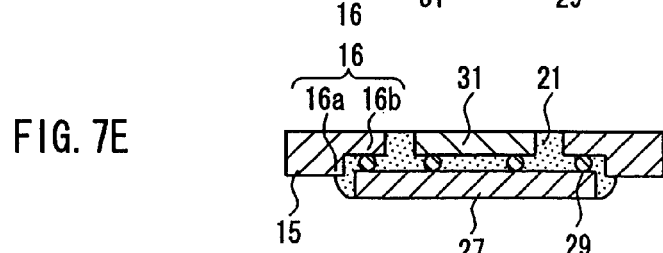

FIG. 7E is a view illustrating the device turned upside down from the state shown in FIG. 7D. As shown in FIG. 7E, by carrying out the so-called back grinding with a rotating grindstone (not shown) on the back face side of the first semiconductor chip 27, the encapsulating resin 21 is ground to be removed until the back face of the first semiconductor chip 27 is exposed. Further, it also is possible to make the resin-encapsulated semiconductor device thinner by further grinding the first semiconductor chip 27 on the back face side.

Figure 7F:
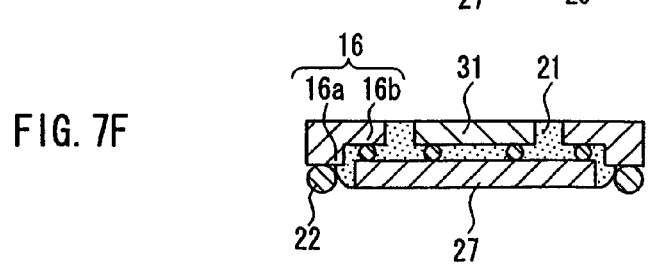

Then, as shown in FIG. 7F, the device encapsulated with the encapsulating resin 21 is separated from the frame 15. Further, ball electrodes made of solder or the like are provided as external electrodes 22 on surfaces of the protruded portions 16a of the inner leads 16. Here, the size of each external electrode 22 is determined so that a tip end of the external electrode 22 protrudes relative to the back face of the first semiconductor chip 27. Subsequently, the inner leads 16 are cut at end portions thereof, and the end faces thereof are adjusted so as to be positioned substantially in the same planes as that of side faces of the encapsulating resin 21.

It should be noted that in the step shown in FIG. 7D, a molding sheet (not shown) may be used when carrying out the resin molding. The molding sheet is applied so as to be in close contact with surfaces of the protruded portions 16a of the inner leads 16, thereby surely preventing the encapsulating resin 21 from adhering to surfaces of the protruded portions 16a. Further, the molding sheet may be applied so that the surfaces of the protruded portions 16a intrudes into the molding sheet. Since this allows the protruded portions 16 to protrude surely from the encapsulating resin, this ensures the electric connection at the protruded portions 16a.

As described above, the method for producing the resin-encapsulated semiconductor device according to the present embodiment allows a set of connected two semiconductor chips of the COC type to be incorporated in a device easily, whereby a high-density and multifunctional resin-encapsulated semiconductor device can be provided.

Embodiment 3

Figure 8A:
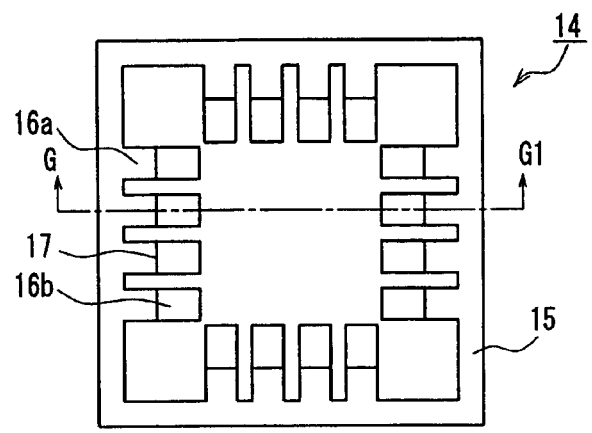
FIGS. 8A to 8G are views illustrating steps of a method for producing a resin-encapsulated semiconductor device according to Embodiment 3 of the present invention.

The following will describe a method for producing a resin-encapsulated semiconductor device according to Embodiment 3, while referring to FIGS. 8A to 8G that illustrate respective steps of the method. The method for producing a resin-encapsulated semiconductor device according to the present embodiment is obtained by slightly modifying the steps of the producing method according to Embodiment 2. FIG. 8A is a plan view of a lead frame 14, and FIGS. 8B to 8G are cross-sectional views of the lead frame taken along a line G–G1 shown in FIG. 8A.

Figure 8B:
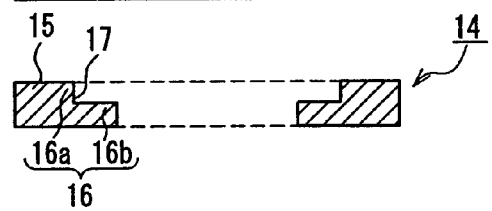
Figure 8C:
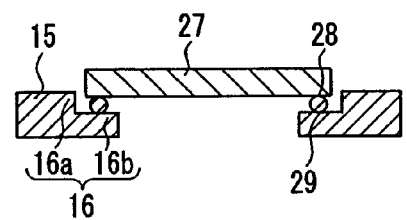
Figure 8D:
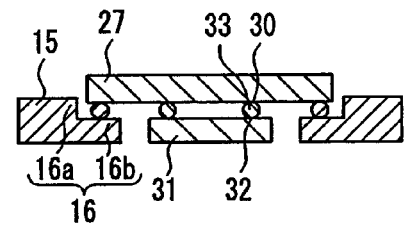

First, as shown in FIGS. 8A and 8B, a lead frame 14 similar to that of Embodiment 1 is prepared. Then, as shown in FIG. 8C, first conductive bumps 29 are formed on first electrodes 28 of a first semiconductor chip 27, and the first conductive bumps 29 are connected electrically with internal portions 16b of the inner leads 16. Next, as shown in FIG. 8D, second conductive bumps 33 are formed on either second electrodes 30 of the first semiconductor chip 27 or electrodes 32 of a second semiconductor chip 31, and the second electrodes 30 of the first semiconductor chip 27 are connected electrically with the electrodes 32 of the second semiconductor chip 31 via the second conductive bumps 33.

Figure 8E:
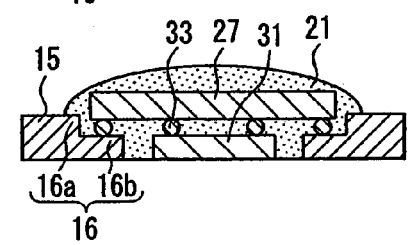

Then, as shown in FIG. 8E, the encapsulating resin 21 is provided to encapsulate a region including the surfaces of the first and second semiconductor chips 27 and 31 and the first and second conductive bumps 29 and 33, except for the frame 15, the protruded portions 16a of the inner leads 16, and the back faces of the inner leads 16.

Figure 8F:
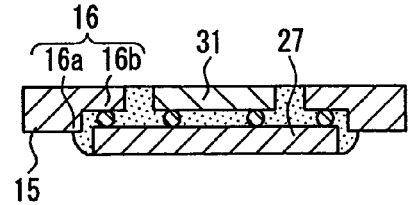

FIG. 8F is a view illustrating the device turned upside down from the state shown in FIG. 8E. As shown in FIG. 8F, by carrying out the so-called back grinding with a rotating grindstone (not shown) on the back face side of the first semiconductor chip 27, the grinding is carried out until the back face of the first semiconductor chip 27 is exposed. Further, it also is possible to make the resin-encapsulated semiconductor device thinner by further grinding the first semiconductor chip 27 on the back face side. Still further, a step of grinding the back face of the semiconductor chip 31 and the back faces of the inner leads 16 at the same time may be performed.

Figure 8G:
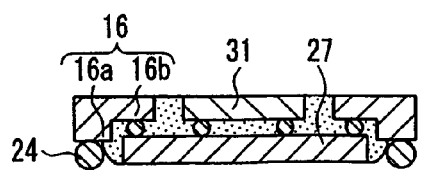
Figure 9:
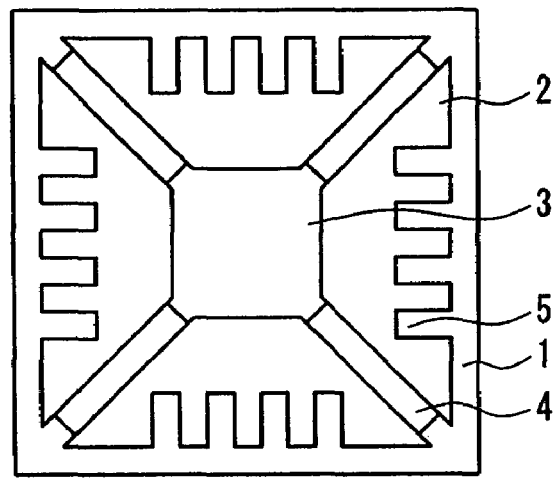
FIG. 9 is a plan view illustrating a conventional lead frame.
Figure 10A:
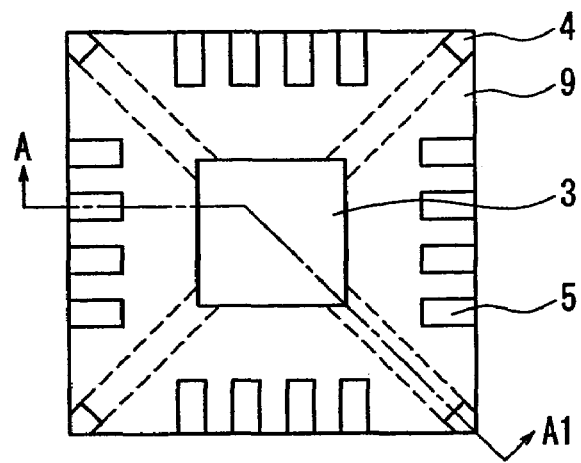
FIG. 10A is a plan view illustrating a conventional resin-encapsulated semiconductor device.
Figure 10B:
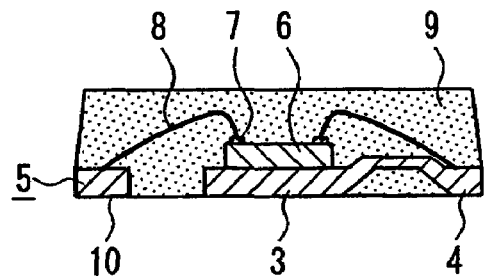
FIG. 10B is a cross-sectional view of the same.
Figure 11A:
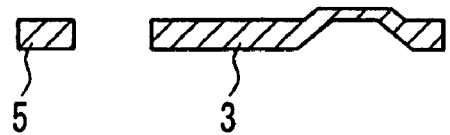
FIGS. 11A to 11E are cross-sectional views illustrating steps of a method for producing the conventional resin-encapsulated semiconductor device.
Figure 11B:
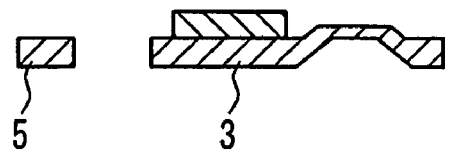
Figure 11C:
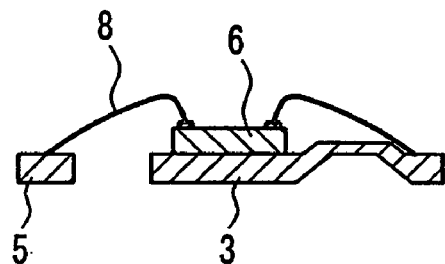
Figure 11D:
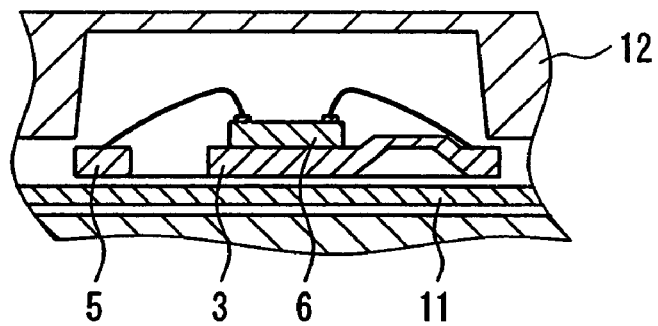
Figure 11E:
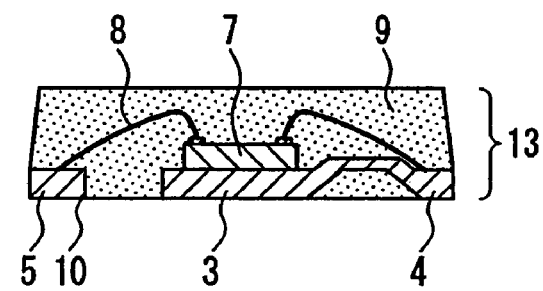

Then, as shown in FIG. 8G, the device encapsulated with the encapsulating resin 21 is separated from the frame 15. Further, ball electrodes made of solder or the like are provided as external electrodes 22 on surfaces of the protruded portions 16a of the inner leads 16. Here, the size of each external electrode 22 is determined so that a tip end of the external electrode 22 protrudes relative to the back face of the first semiconductor chip 27.

In the producing method according to the present embodiment, initially the first semiconductor chip 27 is connected with the inner leads 16, and thereafter, the second semiconductor chip 31 is connected with the first semiconductor chip 27. And the present embodiment, like Embodiment 2, allows a set of connected two semiconductor chips of the COC type to be incorporated in a device easily, whereby a high-density and multifunctional resin-encapsulated semiconductor device can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a resin-encapsulated semiconductor device, comprising:
   using a lead frame that includes a frame and a plurality of inner leads that extend inward from the frame, each of the inner leads having a protruded portion provided on a surface of an external side portion thereof, the protruded portion being protruded in a thickness direction, together with a semiconductor chip having a size such that its periphery falls within an area inward relative to the protruded portions of the inner leads, the semiconductor chip having a group of electrodes;
   forming conductive bumps on the electrodes of the semiconductor chip;
   electrically connecting the electrodes of the semiconductor chip with internal portions of the respective inner leads via the conductive bumps, the internal portions being positioned inward relative to the protruded portions;
   applying a molding sheet so as to be in close contact with surfaces of the protruded portions;
   encapsulating a region including surfaces of the semiconductor chip and the conductive bumps with an encapsulating resin, with the frame and the protruded portions of the inner leads being exposed;
   removing the frame from the encapsulated structure; and
   providing external electrodes on surfaces of the protruded portions so that tip ends of the external electrodes are protruded relative to a back face of the semiconductor chip.

2. A method for producing a resin-encapsulated semiconductor device, comprising:
   using a lead frame that includes a frame and a plurality of inner leads that extend inward from the frame, each of the inner leads having a protruded portion provided on a surface of an external side portion thereof, the protruded portion being protruded in a thickness direction, together with a first semiconductor chip and a second semiconductor chip, the first semiconductor chip having a first electrode group composed of electrodes arranged in its peripheral portion and a second electrode group composed of electrodes arranged inward relative to the first electrode group, the second semiconductor chip being smaller in size than the first semiconductor chip and having a group of electrodes;
   forming first conductive bumps on the electrodes of the first electrode group of the first semiconductor chip, and forming second conductive bumps on the electrodes of the second semiconductor chip;
   stacking the second semiconductor chip on a surface of the first semiconductor chip, and electrically connecting the electrodes of the second electrode group of the first semiconductor chip with the second conductive bumps on the second semiconductor chip;
   applying a molding sheet so as to be in close contact with surfaces of the protruded portions;
   electrically connecting the first conductive bumps with internal portions of the respective inner leads, the internal portions being positioned inward relative to the protruded portions;
   encapsulating a region including surfaces of the first and second semiconductor chips and the first and second conductive bumps with an encapsulating resin, with the frame and the protruded portions of the inner leads being exposed;
   removing the frame from the encapsulated structure; and
   forming external electrodes on surfaces of the protruded portions so that tip ends of the external electrodes are protruded relative to a back face of the first semiconductor chip.

3. The method according to claim 2, further comprising:
   grinding a back face of the second semiconductor chip and back faces of the inner leads at the same time, after the encapsulation.

4. The method according to claim 1, further comprising:
   forming an insulation film on portions except for regions of electric connections with an external board on the surfaces of the protruded portions and the reverse surfaces of the protruded portions.

5. The method according to claim 2, further comprising:
   forming an insulation film on portions except for regions of electric connections with an external board on the surfaces of the protruded portions and the reverse surfaces of the protruded portions.

* * * * *